United States Patent [19]
Chouly et al.

[11] Patent Number: 5,944,850
[45] Date of Patent: Aug. 31, 1999

[54] DIGITAL TRANSMISSION SYSTEM AND METHOD COMPRISING A PUNCTURED PRODUCT CODE COMBINED WITH A QUADRATURE AMPLITUDE MODULATION

[75] Inventors: Antoine Chouly, Paris; Americo Brajal, Villeneuve-le-Roi; David Gianella, Dannemarie, all of France

[73] Assignee: U.S. Philips Corporation, New York, N.Y.

[21] Appl. No.: 08/987,694

[22] Filed: Dec. 9, 1997

[30] Foreign Application Priority Data

Dec. 10, 1996 [FR] France ................................ 96 15160

[51] Int. Cl.$^6$ ...................................................... G06F 11/10
[52] U.S. Cl. ........................... 714/790; 714/792; 375/260; 375/261; 375/265; 375/267; 348/384; 348/390; 348/420; 345/418
[58] Field of Search ............................. 714/790, 37.01, 714/37.11, 37.4, 37.8, 43.1, 45, 792; 375/260, 265, 286, 261, 340, 267; 348/420, 384, 390; 345/949, 418, 473, 960

[56] References Cited

U.S. PATENT DOCUMENTS 4,882,733  11/1989  Tanner ....................................... 371/43
5,321,725  6/1994  Paik et al. ................................ 375/265
5,406,570  4/1995  Berrour et al. ......................... 371/43.4
5,416,801  5/1995  Chouly et al. ........................... 375/260
5,706,312  1/1998  Wei ......................................... 375/298

OTHER PUBLICATIONS

"Turbo Codes and High Spectral Efficiency Modulation" by Stephane Le Goff et al., New Orleans Supercomm/ICC, May 1–5, 1994, pp. 645–649.

"Near Shannon Limit error–correcting coding and decoding: Turbo–codes (1)" by C. Berrou et al, Proceeding of ICC '93, Geneva, May 1993, pp. 1064–1071.

*Primary Examiner*—William Grant
*Assistant Examiner*—McDieunel Marc
*Attorney, Agent, or Firm*—Leroy Eason

[57] ABSTRACT

A digital transmission system which provides transmission error protection for transmitted data. The input data is encoded using a punctured systematic convolutional trellis code. Row and column components of a matrix formed by the encoded input data are then used to generate a product code in blocks, with trellis closure by addition of redundant data. The data thus encoded is then allocated to quadrature amplitude modulation symbols. At the receiver end the transmitted modulation symbols are decoded by iterative decoding, the reliability of hard decisions being computed so as to provide generation of soft decision output symbols.

6 Claims, 7 Drawing Sheets

DIGITAL TRANSMISSION SYSTEM AND METHOD COMPRISING A PUNCTURED PRODUCT CODE COMBINED WITH A QUADRATURE AMPLITUDE MODULATION

RELATED APPLICATION

This invention is related to a concurrently filed copending application, Ser. No. 08/987,695, Atty Docket No. PHF 96-623, concerning certain of the inventions herein and which is assigned to the same assignee. Such application relates to coding employing a product code combined with a multidimensional modulation.

FIELD OF THE INVENTION

The invention relates to a digital transmission system with error protection of the transmitted input data, comprising a coder for coding said data and an iterative decoder. The coder includes a first sub-set for performing a systematic convolutional trellis coding which is consistent with the iterative decoding, and a second sub-set for allocating the coded data to digitally modulated symbols.

The invention also relates to a method of error protection of transmitted input data, which method is implemented in such a digital transmission system.

The system may be utilized for digital transmission in systems for cable television, satellite television, terrestrial broadcasting, transmission over telephone lines or otherwise.

BACKGROUND OF THE INVENTION

Selective error protection systems are known which combine convolutional coding with digital modulation. More particularly, for enhancing the performance of such a system in terms of bit error rates, a new class of convolutional codes called turbo codes has been described in the document entitled: "Near Shannon limit error-correcting coding and decoding: Turbo-codes (1), C. BERROU, A. GLAVIEUX, P. THITIMAJSHIMA, Proceeding of ICC '93, Geneva, May 1993, pp. 1064–1071. These turbo codes have a performance, expressed in bit error rates, close to theoretical limits provided by Shannon. They are parallel concatenated convolutional codes. These convolutional codes are based on systematic punctured recursive codes, that is, they are derived from codes of rate 1/2 for which an input bit gives rise to two output bits, the puncturing being applied to the bits themselves. The concatenation as such is realized by an appropriate interleaving of the data that contain the information.

At the receiving end, the iterative decoding, called turbo decoding, consists of decoding the received symbols several times to improve the performance of the system in terms of bit error rates. The successive iterative decodings are carried out by a single soft-decision Viterbi decoder. This decoder differs from a conventional Viterbi decoder, which makes a hard decision. In this document, the soft decisions on the output of the decoder produce a hard-decision reliability ratio, that is, a correct decision likelihood. The decoder is then followed by an appropriate interleaving of the output data.

However the use of turbo codes followed by an iterative decoding as described in said document does not overcome the limitations of punctured systematic codes derived from codes of rate 1/2, especially when the latter codes are applied separately from the digital modulation with which they co-operate. More particularly, a disadvantage of these codes is that they are adapted only to modulations having a low spectral efficiency (less than or equal to two bits/s/Hz), such as the MDP2 and MDP4 phase modulations. A bit rate equal to a maximum of twice the band used corresponds to these codes. For augmenting the rate of a fixed occupied band, one could look for utilizing high spectral efficiency modulations of the quadrature amplitude modulation type (QAM). But the use of the punctured convolutional codes described above, juxtaposed with QAM modulations, does not provide optimum performance, because these codes have been designed irrespective of the modulation.

SUMMARY OF THE INVENTION

It is an object of the invention to enhance the performance of such digital transmission systems by achieving a proper functioning of the system with a minimum signal-to-noise ratio and improved spectral efficiency.

This object is achieved with a system in which the coder includes a first sub-set which utilizes a systematic convolutional trellis coding having a coding rate M/2M, where M is an integer greater than 1. The system applies a puncturing to the symbols so as to obtain a higher coding rate, the punctured systematic convolutional trellis code thus obtained being used for generating a product code in blocks with trellis closure by the addition of redundant data. The product code is formed from components generated by row coding and column coding of a matrix that collects the data which has been coded via the punctured systematic convolutional trellis code. The coder further includes a second sub-set which combines the product code with a $2^2M$-state quadrature amplitude modulation, the iterative decoding being a block decoding.

For generating the product code and the added redundant data on the basis of systematic convolutional codes, the coder may comprise a state machine which defines output states, redundancy symbols being based on input states and data symbols.

Preferably, the state machine is coupled to a reading table for determining the redundancy symbols of the convolutional code and the symbols used for closing the trellis.

The invention also relates to an input data protection method implemented in such a digital transmission system, the method comprising a coding phase for coding said data and an iterative decoding phase, the coding phase comprising a first systematic convolutional trellis coding step which permits of the iterative decoding, which step is combined with a second step of allocating coded data to digitally modulated symbols. During the first step the systematic convolutional trellis coding has a coding rate M/2M, where M is an integer greater than 1, the coding being subjected to a puncturing applied to the symbols to obtain a higher coding rate, the punctured systematic convolutional codes thus obtained being used for generating a product code in blocks with trellis closure by the addition of redundant data. The product code is formed by components generated by row coding and column coding of a matrix that collects the data coded via the punctured systematic convolutional code. The second step combines the product code with a $2^{2M}$-state quadrature amplitude modulation, the iterative decoding being a block decoding.

A convolutional coding is discussed here having a rate M/2M (preferably a rate 2/4) and which is punctured to obtain a higher rate (preferably a rate 7/8). This coding is combined with a $2^{2M}$-state digital modulation (16-QAM, respectively), the coding and the puncturing being combined to achieve optimum performance. According to this example (M=2, rate 7/8), such a coding is obtained by processing a bit stream in which bits (called input bits) are combined in pairs to code them into four bits (called output bits) which are in their turn punctured to obtain 16 output bits for every 14 input bits. The 2M output bits (the four bits, respectively) select two $2^M$-level symbols (four-level symbols, respectively $\{+1, -1, +3, -3\}$), that is to say, two real $2^M$-level amplitude modulation symbols with M output bits per symbol (four-level 4-AM respectively, with two output bits per symbol). Downstream of the coder, there is a puncturing of two $2^M$-AM (4-AM respectively) modulation output symbols and not of the bits. The puncturing is defined by a puncturing matrix. The product code is realized by applying the punctured systematic convolutional coding to the rows and columns of a matrix that contains the information bits, with trellis closure for each row and each column. Finally, the 4-AM symbols coming from the matrix after the product code are combined in pairs to generate the 16-QAM symbols. The coded data are then transmitted via a carrier according to customary techniques.

For effecting turbo decoding at the receiver end, the produced coding is to be systematic. Therefore, systematic convolutional codes are to be used. That is, after the coding the input information symbols can be recovered again st the output without change.

The convolutional codes having a rate M/2M, for example 2/4, described hereafter, are arranged in such a way that after puncturing they are optimized. That is, they give the lowest error rate for a given signal-to-noise ratio and this specifically for the 4-AM or 16-QAM modulation. In this manner, a system is obtained having optimum performance both as regards signal-to-noise ratio and spectral efficiency by the combination of a coder structure which realizes in optimum fashion the systematic convolutional coding with a rate 2/4 with a puncturing matrix realizing the puncturing in optimum fashion. The structure and the matrix are optimized for working together. The optimum puncturing matrix depends on the sought final rate.

The invention relates to a product code using a systematic convolutional code combined with a quadrature amplitude modulation, and not to a juxtaposition.

This system has various advantages.

Compared to the prior-art system which utilizes binary punctured codes with an MDP4 phase modulation, the transmission capacity is twice higher (spectral efficiency between two and four bits/s/Hz).

This system does not have much hardware complexity, because only a single soft-decision decoder is necessary for performing the iterative decoding of the product code.

The codes used are preferably systematic convolutional codes of rate 2/4, with two input bits and four output bits. The function that generates the four output bits as a function of the two input bits and of the state (memory) of the coder has been optimized in view of the 16-QAM modulation.

The puncturing is applied to 4-AM symbols, that is to say, to real symbols assuming four possible values $(+1, -1, +3, -3)$ and not to bits as is the case with the prior-art puncturing.

The punctured convolutional codes, which are preferably of rate 7/8, are chosen so that the minimum Euclidian distance of these codes combined with the 16-QAM modulation is maximum to improve performance. This particularly refers to the combination of the coding with the modulation.

These and other aspects of the invention will be apparent from and elucidated with reference to the embodiments described hereinafter.

DESCRIPTION OF EMBODIMENTS

Figure 1:
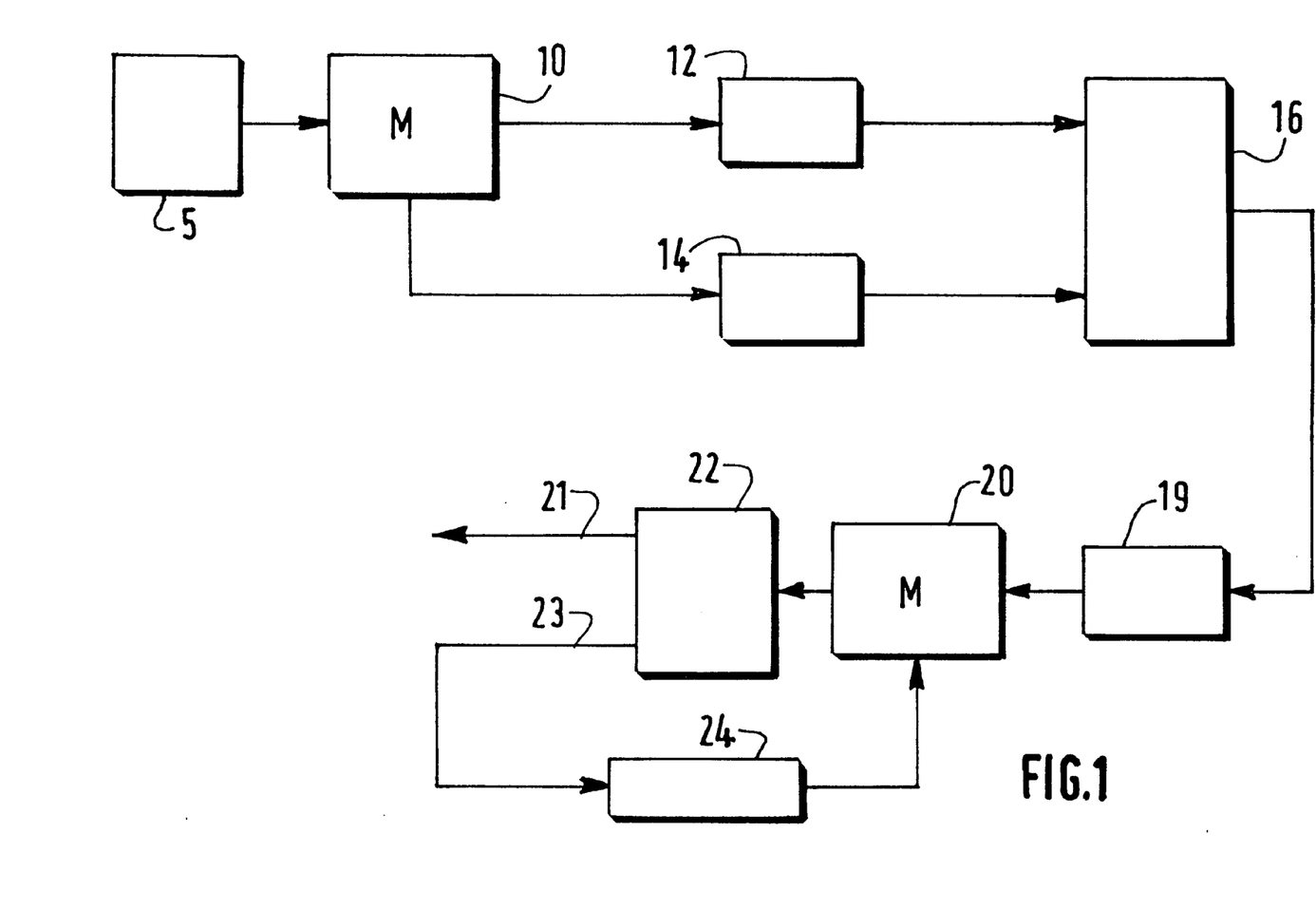
FIG. 1: shows a diagram of a baseband digital transmission system according to the invention.

FIG. 1 is a diagram of a baseband digital transmission system according to the invention. The input data to be protected coming from a source 5 are organized in a matrix, for example, by storing them in a memory 10 arranged in rows and columns which may be addressed separately. The system comprises row coder 12 and column coder 14. The two coders each produce data which are allocated to 4-AM digitally modulated symbols. An allocation element 16 transforms the 4-AM symbols into 16-QAM symbols. This is effected by combination in pairs of the 4-AM product code output symbols of the row and column coders.

These symbols are transmitted according to customary techniques through a channel 19 to receiver means. The received data pass through a temporary store (for example, a memory 20) which permit of carrying out the loop processing to be described hereinafter. At the output of the memory 20, the data enter a Viterbi decoder 22 which has two outputs, one hard-decision output 21 which delivers the estimated symbols obtained for each iteration and one soft-decision output 23 which is looped back for iterative decoding to the memory 20 through a data interleaver 24. The estimated symbols are more and more reliable as the iterative processing is repeated. On average, this improvement, measured in error rates, is obtained after four or five iterations.

TABLE I

| | | | | | | | |
|---|---|---|---|---|---|---|---|
| $S_{11}$ | ... $S_{1,j}$ | ... $S_{1,7N}$ | $R_{11}$ | ... $R_{1,j}$ | ... $R_{1,7N}$ | $TR_{11}, TR_{12}$ | |
| ... | | | ... | | | ... | |
| $S_{i1}$ | ... $S_{i,j}$ | ... $S_{i,7N}$ | $R_{i1}$ | ... $R_{i,j}$ | ... $R_{i,7N}$ | $TR_{i,1}, TR_{i,2}$ | |
| ... | | | ... | | | ... | |
| $S_{7N,1}$ | ... $S_{7N,j}$ | ... $S_{7N,7N}$ | $R_{7N,1}$ | ... $R_{7N,j}$ | ... $R_{7N,7N}$ | $TR_{7N,1}, TR_{7N,2}$ | |
| $C_{11}$ | ... $C_{1,j}$ | ... $C_{1,7N}$ | | | | | |
| ... | | | | | | | |
| $C_{i1}$ | ... $C_{i,j}$ | ... $C_{i,7N}$ | | | | | |
| ... | | | | | | | |
| $C_{N,1}$ | ... $C_{N,j}$ | ... $C_{N,7N}$ | | | | | |
| $TC_{11}$ | ... $TC_{1,j}$ | ... $TC_{1,7N}$ | | | | | |
| $TC_{21}$ | ... $TC_{2,j}$ | ... $TC_{2,7N}$ | | | | | |

Figure 2:
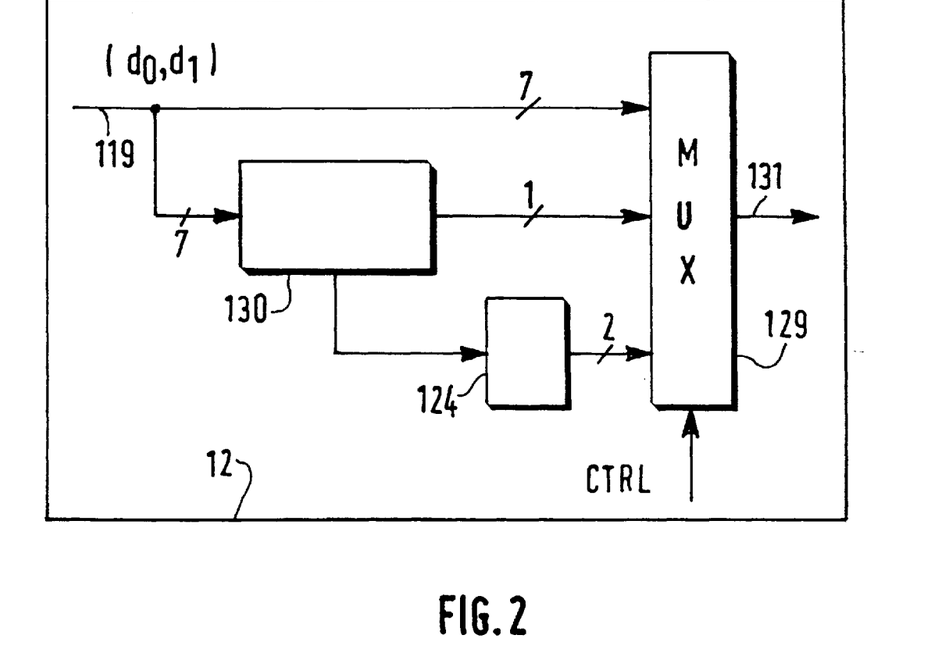
FIG. 2: shows a general circuit diagram of a coder which permits of generating the product code.

For obtaining the product code, the coding of a row of the matrix is performed in the following fashion (FIG. 2) by the row coder. Consider by way of example a punctured systematic convolutional code of rate 7/8 (coder 130). With 7 useful information symbols (Table I), 8 symbols comprising the 7 useful symbols (systematic convolutional code) plus one redundancy symbol are generated. Consider the first row of the matrix formed by N blocks of 7 information symbols, that is, 14 bits per block, which symbols are:

$(S_{11}, \ldots S_{17}), (S_{18}, \ldots S_{1,14}), \ldots, (S_{1,7(N-1)+1}, \ldots S_{1,7N})$.

For each block, the applicable redundancy symbol (i.e. 2 bits) of the punctured systematic convolutional code (FIG. 2) is computed. The block 1 produces $R_{11}$, the block 2 produces $R_{12}$ and so on and so forth, up to block N which produces $R_{1,N}$.

Suppose that the initial state of the coder 130 is equal to zero. Having generated $R_{1,N}$, the coder is in the state $\sigma(N)$. The trellis is closed by forcing the state of the trellis to zero by generating 2 information symbols $TR_{11}$ and $TR_{12}$ (for a 16-state code) corresponding to 2 transitions in the convolutional code trellis, so that after these 2 transitions the state $\sigma=0$ is arrived at. For a code having more states, it is necessary to use more trellis closing symbols. The closing symbols $TR_{11}$ and $TR_{12}$ are functions of the trellis state $\sigma(N)$ after the coding of a row and are generated by a memory table addressed by $\sigma(N)$.

The row coder 12 operates in the following manner. The input symbols d0, d1 enter the coder 130 of rate 7/8 which delivers a redundancy symbol for each block of 7 information symbols. A multiplexer 129 serializes the symbols. Therefore, it produces on its output 131 in sequence, groups of 8 symbols, each group being formed by the 7 information symbols and the redundancy symbol corresponding to this block. The multiplexer subsequently delivers all the groups of 8 consecutive symbols. When all the groups have been extracted, the multiplexer extracts the 2 trellis closing symbols delivered by a memory table 124 for determining closing symbols.

The symbols $TR_{11}$ and $TR_{12}$ each have two bits. The Table II which follows gives the values expressed in decimal notation assumed by these two bits as a function of the state of the coder for the 16-state code. The values of the bits of each symbol are also given in decimal notation to facilitate the description of the Table.

TABLE II

| $\sigma(N)$ (binary) | $\sigma(N)$ (decimal) | TR11, TR12 (decimal) | $\sigma(N + 1), \sigma(N + 2)$ (decimal) |
|---|---|---|---|
| 0000 | 0  | (0,0) | 0,0 |
| 1000 | 8  | (2,2) | 4,0 |
| 0010 | 2  | (2,1) | 1,0 |
| 1010 | 10 | (0,3) | 5,0 |
| 0100 | 4  | (2,0) | 0,0 |
| 1100 | 12 | (0,2) | 4,0 |
| 0110 | 6  | (0,1) | 1,0 |
| 1110 | 14 | (2,3) | 5,0 |
| 0001 | 1  | (1,0) | 0,0 |
| 1001 | 9  | (3,2) | 4,0 |
| 0011 | 3  | (3,1) | 1,0 |

TABLE II-continued

| $\sigma(N)$ (binary) | $\sigma(N)$ (decimal) | TR11, TR12 (decimal) | $\sigma(N + 1), \sigma(N + 2)$ (decimal) |
|---|---|---|---|
| 1011 | 11 | (1,3) | 5,0 |
| 0101 | 5  | (3,0) | 0,0 |
| 1101 | 13 | (1,2) | 4,0 |
| 0111 | 7  | (1,1) | 1,0 |
| 1111 | 15 | (3,3) | 5,0 |

The symbols $TR_{11}$ and $TR_{12}$ may be stored in memory table 124 addressed by the state of the coder.

The other rows are processed in similar manner.

In like manner, a similar processing is realized for the columns (column coder 14). The first block of the first column is formed by the symbols:

$S_{11}, S_{21} \ldots S_{7N,1}$. One redundancy symbol will correspond to each block, for example, the symbol $C_{11}$ will correspond to the first block and the symbol $C_{N,1}$ will correspond to the last block. The trellis closing redundancy symbols for the first column will be the symbols $TC_{11}$ and $TC_{21}$. All the data formed by the initial information symbols, the row and column coding redundancy symbols and the trellis closing symbols form the product code. The product coding realized according to the system of FIG. 1 employs a matrix in accordance with Table I.

One row of this product code will form a symbol block which is used for coding symbols having a modulation of 4-AM. As the initial information symbols remain the same in the product code whether they are read per row or per column, for utilizing the columns of the product code it is needless to use the initial information symbols once again. Thus only the redundancy symbols of the product code columns are used for coding (column coder 14) 4-AM modulation symbols. The 4-AM symbols coming from the rows and columns of the product code are used for coding a 16-QAM modulation in the allocating element 16.

For enhancing the performance of the system it is possible also to code the redundancy symbols which have just been computed. In that case, the information matrix of 7N×7N is coded following the rows and columns to obtain the row redundancy (symbols $R_{ij}$ and $TR_{ij}$) and the column redundancy (symbols $C_{ij}$ and $TC_{ij}$) in the same manner as that which has just been described. Thus, the row redundancy is coded in a column and the column redundancy in a row to enhance the performance of the system. Thus, for example, the block of 7N symbols ($R_{11}, \ldots R_{7N,1}$) is coded for generating the N column redundancy symbols ($RC_{11}, \ldots RC_{N,1}$) originating from the code redundancy 7/8 and the two trellis closing redundancy symbols ($RCT_{11}$, $RCT_{21}$). The same is done for the other columns of the row redundancy ($R_{1,j}, \ldots R_{7N,j}$) for j=1, ... N and the 2 columns ($TR_{11} \ldots TR_{7N,1}$) and ($TR_{12}, \ldots TR_{7N,2}$). Also the rows of the column redundancy are coded, that is to say, the rows ($C_{i,1}, \ldots C_{i,7N}$) for i=1, ... N and the 2 rows ($TC_{11}, \ldots TC_{1,7N}$ and $TC_{21}, \ldots TC_{2,7N}$).

The following matrix is then obtained:

TABLE III

| $S_{11} \ldots S_{1,j} \ldots S_{1,7N}$ | $R_{11} \ldots R_{1,j} \ldots R_{1,7N}$ | $TR_{11}, TR_{12}$ |
|---|---|---|
| ... | ... | ... |
| $S_{i1} \ldots S_{i,j} \ldots S_{i,7N}$ | $R_{i1} \ldots R_{i,j} \ldots R_{i,7N}$ | $TR_{i,1}, TR_{i,2}$ |
| ... | ... | ... |

TABLE III-continued

| $S_{7N,1} \ldots S_{7N,j} \ldots S_{7N,7N}$ | $R_{7N,1} \ldots R_{7N,j} \ldots R_{7N,7N}$ | $TR_{7N,1}, TR_{7N,2}$ |
|---|---|---|
| ... | ... | ... |
| $C_{11} \ldots C_{1,j} \ldots C_{1,7N}$ | $RC_{11} \ldots RC_{1,j} \ldots RC_{i,N}$ | $TRC_{11}, TRC_{12}$ |
| ... | ... | ... |
| $C_{i1} \ldots C_{i,j} \ldots C_{i,7N}$ | $RC_{i1} \ldots RC_{i,j} \ldots RC_{i,N}$ | $TRC_{i,1}, TRC_{i,2}$ |
| ... | ... | ... |
| $C_{N,1} \ldots C_{N,j} \ldots C_{N,7N}$ | $RC_{N,1} \ldots RC_{N,j} \ldots RC_{N,N}$ | $TRC_{N,1}, TRC_{N,2}$ |
| $TC_{11} \ldots TC_{1,j} \ldots TC_{1,7N}$ | $RCT_{11} \ldots RCT_{1,j} \ldots RCT_{1,N}$ | $TRCT_{11}, TRCT_{12}$ |
| $TC_{21} \ldots TC_{2,j} \ldots TC_{2,7N}$ | $RCT_{21} \ldots RCT_{2,j} \ldots RCT_{2,N}$ | $TRCT_{21}, TRCT_{22}$ |
|  | $CR_{11} \ldots CR_{1,j} \ldots CR_{1,N}$ | $CRT_{11}, CRT_{12}$ |
|  | ... | ... |
|  | $CR_{i,1} \ldots CR_{i,j} \ldots CR_{i,N}$ | $CRT_{i,1}, CRT_{i,2}$ |
|  | ... | ... |
|  | $CR_{N,1} \ldots CR_{N,j} \ldots CR_{N,N}$ | $CRT_{N,1}, CRT_{N,2}$ |
|  | $TCR_{11} \ldots TCR_{1,j} \ldots TCR_{1,N}$ | $TCRT_{11}, TCRT_{12}$ |
|  | $TCR_{2,1} \ldots TCR_{2,j} \ldots TCR_{2,N}$ | $TCRT_{21}, TCRT_{22}$ |

Figure 7:
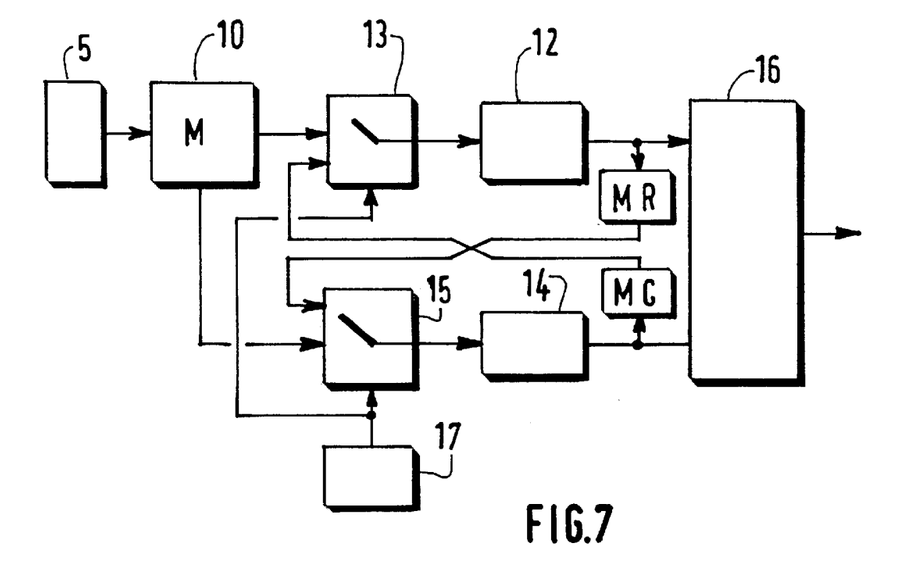
FIG. 7: shows a coder for coding the redundancy symbols uniformly.

A coder which permits of making this double redundancy coding is shown in block form in FIG. 7. The same elements as those of FIG. 1 have the same reference numerals. In the case of the example under consideration, the memory 10 contains $49N^2$ symbols. Another memory MR contains the $7N(N+2)$ row redundancy symbols (symbols $R_{i,j}$, $TR_{i,j}$). Another memory MC contains the $7N(N+2)$ column redundancy symbols (symbols $C_{i,j}$ and $TC_{i,j}$). The memories MR and MC are loaded after finishing the row and column coding of M. Subsequently, the coding MR is performed in accordance with the columns and the coding MC in accordance with the rows to generate the $(N+2)^2$ 4-AM symbols ($RC_{ij}$, $TRC_{ij}$, $RCT_{ij}$ and $TRCT_{ij}$) and the $(N+2)^2$ 4-AM symbols ($CR_{ij}$, $CRT_{ij}$, $TCR_{ij}$, and $TCRT_{ij}$), respectively. Reversing switches 13 and 15 ensure the proper course of the operations under the control of a controller 17.

Finally, all the 4-AM symbols formed for each codeword of the product code of the Tables I or III are regrouped in pairs and transmitted over the channel in the form of complex symbols of the 16-QAM constellation (in a well-defined order).

The rate of the product code without coding the redundancy is equal to:

$$\rho_1 = \frac{7N}{9N+4}.$$

The spectral efficiency is then equal to 4 times this rate. The spectral efficiency is 3 bits/s/Hz for N=12.

With a double coding of the redundancy, the rate of the product code becomes equal to:

$$\rho_2 = \frac{49N^2}{65N^2 + 36N + 8}.$$

Thus, with N=12, a spectral efficiency of 2.88 bits/s/Hz is obtained. There is a loss of spectral efficiency for coding the redundancy of 0.12 bits/s/Hz, but the performance of the system is enhanced.

Figure 3:
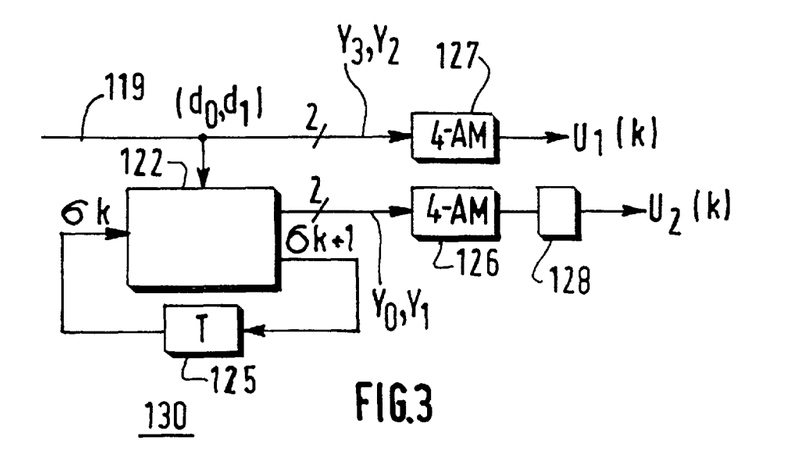
FIG. 3: shows a general circuit diagram of a systematic convolutional coder of rate 2/4 combined with a 4-AM modulation with puncture coding.

The invention relates to information data subjected to a systematic convolutional coding. FIG. 3 gives an embodiment of the punctured systematic convolutional coder which thus also forms part of the row and column coder of FIG. 1. FIG. 3 shows how to realize the 7/8 code by cascading a code 2/4 and a puncturing of that code. The input information symbols $(d_0(k), d_1(k))$ to be coded arrive via the connection 119. For generating a systematic convolutional code of rate 2/4, the processing is made in blocks of 2 bits. These two bits remain unchanged $Y_3$, $Y_2$ for coding a 4-AM modulation in the modulation means 127 which produce the information symbols U1(k). The allocation of the bits $Y_3$, $Y_2$ to the 4-AM symbols is represented in Table IV.

TABLE IV

| $(Y_3, Y_2)$ resp. $(Y_1, Y_0)$ | 00 | 01 | 10 | 11 |
|---|---|---|---|---|
| $U_1$ resp. $U_2$ | +3 | +1 | −1 | −3 |

On the other hand, the same input symbols enter a state machine 122 which determines a successive state $\sigma_{k+1}$ of the decoder based on a preceding state $\sigma_k$. A delay element 125 ensures the time shift by one symbol duration. The state machine 122 produces two bits $Y_0$ and $Y_1$ which are used for coding a 4-AM modulation (block 126) (Table IV) and which are followed by a matrixing element 128 for puncturing the code and producing the symbols U2(k).

For obtaining a code of a higher rate than M/2M, the redundancy symbols U2 have to be subjected to a puncturing (FIG. 3). According to the puncturing procedure, the transmission of certain redundancy symbols is prohibited as a function of a matrix (called the puncturing matrix), and this is done periodically. The puncturing consists of not transmitting all the symbols U2 at certain moments. A zero in the matrix is understood to mean that the corresponding symbol is not transmitted. By way of example, the puncturing is applied to the code of rate 2/4, thereby obtaining a punctured code of rate 7/8 at the output of matrixing element 128.

Based on the 7 information symbols (d1, d0), the same symbols U1 (4-AM symbols) are transmitted as well as 1 redundancy symbol U2 which corresponds to the redundancy bits (Y3, Y2) generated during the coding of the $7^{th}$ (last) symbol of the block with the convolutional code of rate 2/4. The puncturing matrix of the 16-state code is:

$$A = \begin{vmatrix} 1 & 1 & 1 & 1 & 1 & 1 & 1 \\ 0 & 0 & 0 & 0 & 0 & 0 & 1 \end{vmatrix}.$$

The first row of the matrix relates to the symbol U1 and a second row relates to the symbol U2.

Instead of transmitting 4 bits for each column of the matrix, only 2 bits are transmitted for the columns containing a zero in the matrix. Thus, with the matrix A, the puncturing permits of transmitting in 7 periods only 8 symbols of the 14 symbols generated by the mother code of rate 2/4.

Thus, the rate of the punctured code becomes higher than that of the non-punctured code, that is to say, for the same number of information bits (on the input of the coder) the number of transmitted bits is smaller than that of the non-punctured code.

At an instant kT, the bits $(Y_0, Y_1)$, $(Y_2, Y_3)$ are used, respectively, for selecting the symbols U1 and U2 of the 4-AM amplitude modulation in the devices 126, 127.

Figure 4:
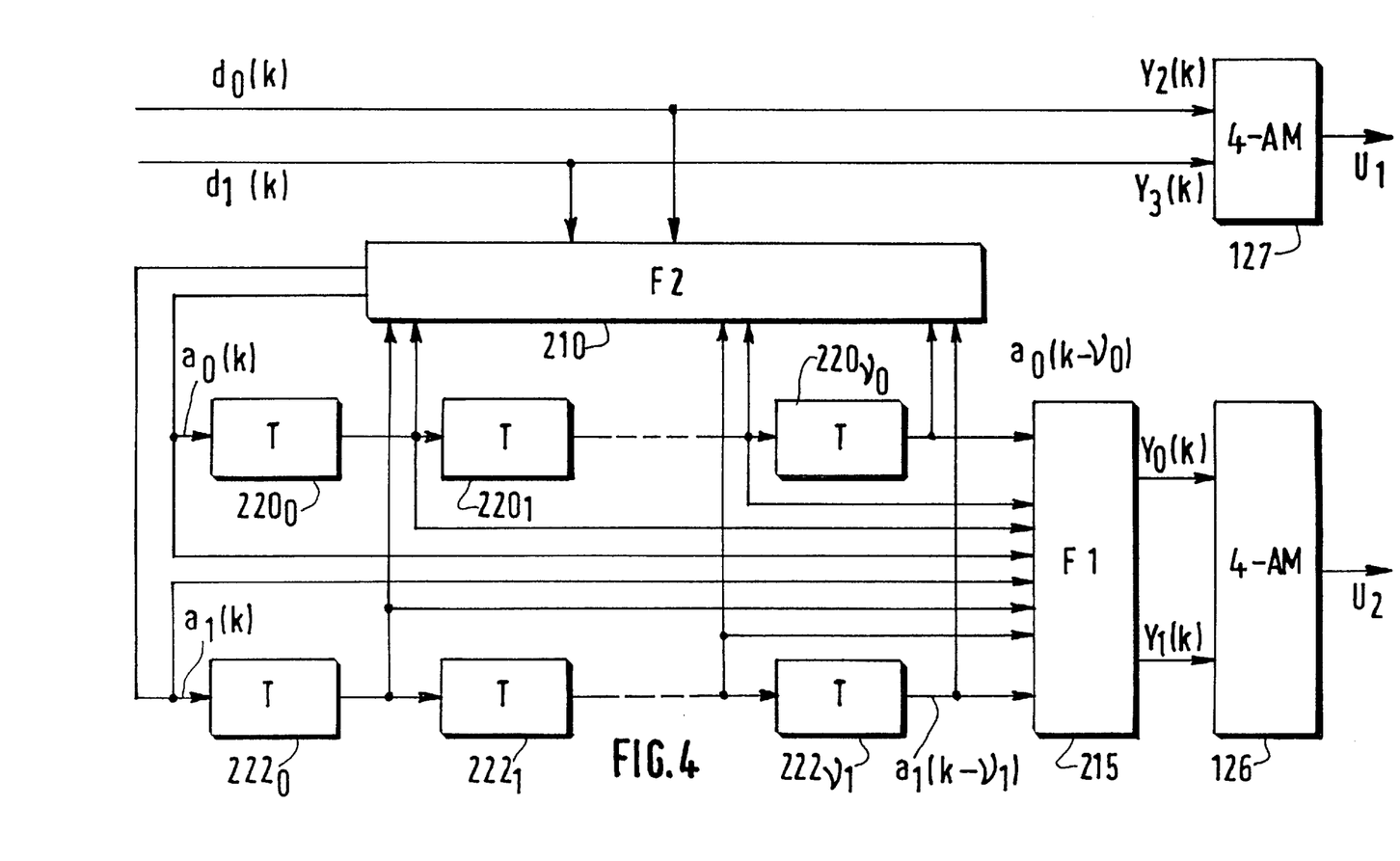
FIG. 4: shows a diagram of a particular embodiment of the coder for a code of rate 2/4.

FIG. 4 is a particular diagram relating to a systematic convolutional coder of rate 2/4 which is capable of replacing the state machine 122. The input symbols $d_0(k)$ and $d_1(k)$ enter a device 210 which applies a linear function F2 which produces two symbols $a_0(k)$ and $a_1(k)$. These symbols enter two chains of shift cells $220_0, 220_1, \ldots, 220_{v0}$ and $222_0, 222_1, \ldots 222_{v1}$ which produce on the output of their last cell the respective delayed symbols $a_0(k-v0)$ and $a_1(k-v1)$. The outputs of all the delay cells enter the device 210 which applies the linear function F2 and a device 215 which applies a linear function F1. The device 215 also receives the symbols a0(k) and a1(k). The device 215 produces the coded symbols $Y_0(k)$ and $Y_1(k)$ which enter the modulator means 126 which produces the symbol U2.

By way of example, a systematic convolutional code is obtained with the coder in FIG. 4 wherein the functions F1 and F2 have the following values:

function F1:

$$Y_2(k) = d_0(k)$$

$$Y_3(k) = d_1(k)$$

$$Y_0(k) = \sum_{l=0}^{v_0} h_{00}^l a_0(k-l) \oplus \sum_{l=0}^{v_1} h_{10}^l a_1(k-l)$$

$$Y_1(k) = \sum_{l=0}^{v_0} h_{01}^l a_0(k-l) \oplus \sum_{l=0}^{v_1} h_{11}^l a_1(k-l)$$

where the $\Sigma$ designates a modulo-2 sum.

function F2:

$$a_0(k) = d_0(k) \oplus \sum_{l=1}^{v_0} h_{02}^l a_0(k-l) \oplus \sum_{l=0}^{v_1} h_{12}^l a_1(k-l)$$

$$a_1(k) = d_1(k) \oplus \sum_{l=1}^{v_0} h_{03}^l a_0(k-l) \oplus \sum_{l=1}^{v_1} h_{13}^l a_1(k-l)$$

with $(h_{03}^0, h_{12}^0) \neq (1, 1)$

The symbol $\Sigma$ designating a modulo-2 sum, the sign $\oplus$ being an EX-OR. The coefficients $h_{ij}^l$ are binary coefficients and $(a_0(k-l), a_1(k-l'))$ for $l=1, \ldots, \sigma_0$ and $l'=1, \ldots, \sigma_1$ represent the state 94 $_k$ of the coder at the instant k.

Figure 5:
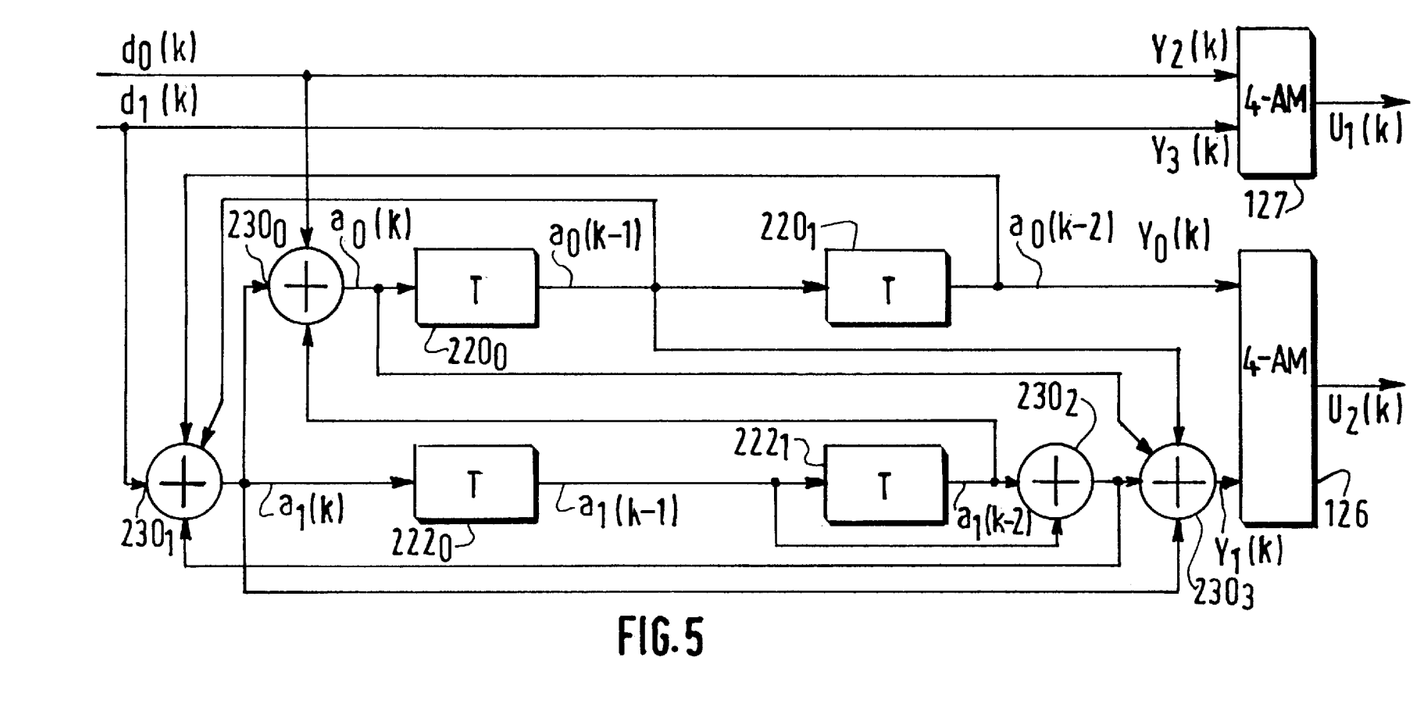
FIG. 5: shows a diagram of a particular example of a 16-state coder for obtaining a systematic convolutional coding of rate 2/4.

FIG. 5 is a particular case of FIG. 4 for which the number of shift cells is limited to $v_0=v_1=2$, that is to say, for a 2/4 code to 16 states. The functions F1 and F2 are realized with the aid of summation cells $230_0, 230_1, 230_2, 230_3$.

the summation cell $230_0$ receives d0(k), a1(k−2) and the output of the summation cell $230_1$ and delivers $a_0(k)$.

the summation cell $230_1$ receives d1(k), a0(k−1), a0(k−2) and the output of the summation cell $230_2$ and delivers a1(k).

the summation cell $230_2$ receives a1(k−1) and a1(k−2).

the summation cell $230_3$ receives a0(k), a0(k−1), a1(k) and the output of the summation cell $230_2$.

The equations which relate to the diagram of FIG. 5 are:

$$Y_2(k) = d_0(k)$$

$$Y_3(k) = d_1(k)$$

$$Y_0(k) = a_0(k-2)$$

$$Y_1(k) = a_0(k) \oplus a_0(k-1) \oplus a_1(k) \oplus a_1(k-1) \oplus a_2(k-2)$$

with:

$$a_0(k) = d_0(k) \oplus a_1(k) \oplus a_1(k-2)$$

$$a_1(k) = d_1(k) \oplus a_0(k-1) \oplus a_0(k-2) \oplus a_1(k-1) \oplus a_1(k-2)$$

Figure 6:
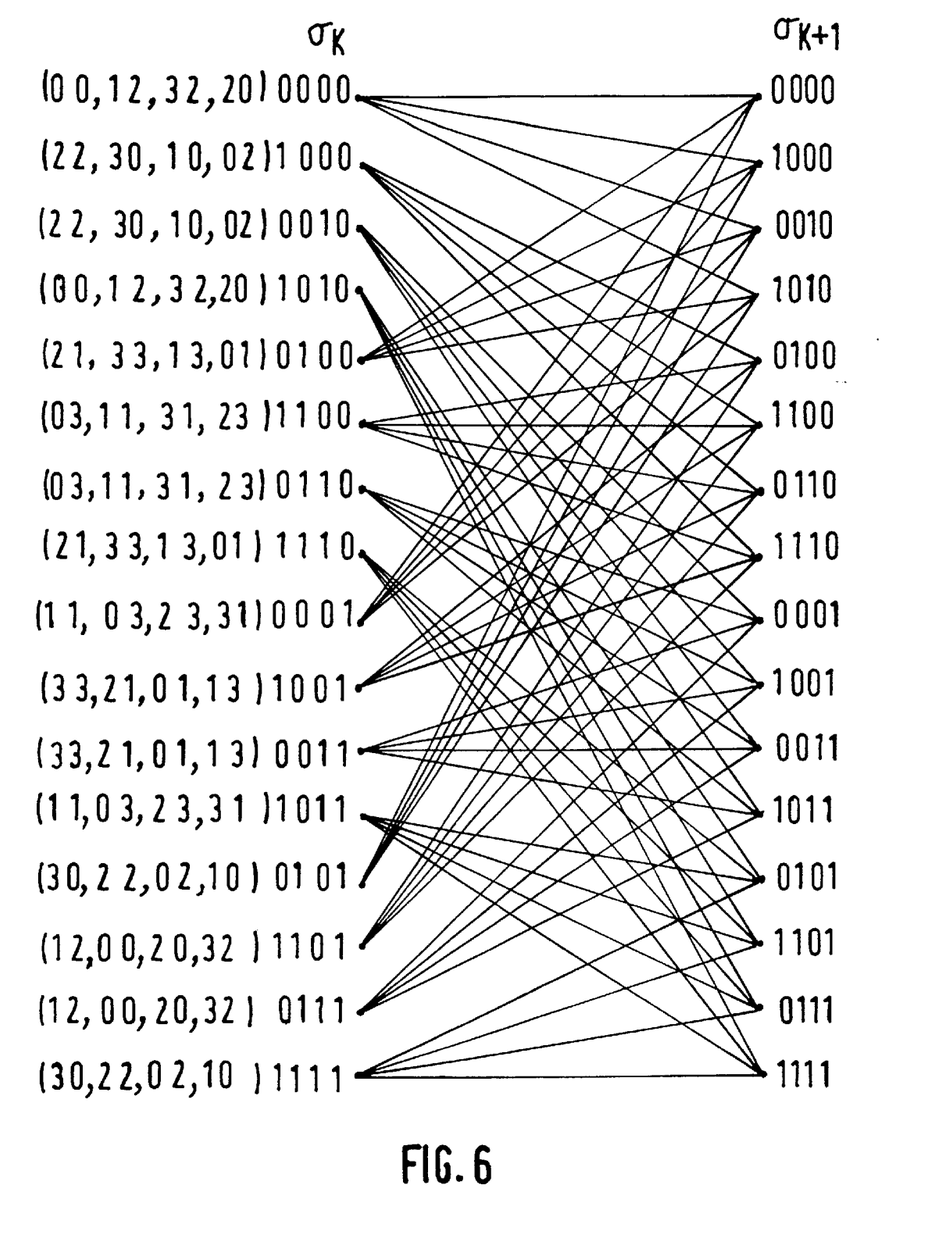
FIG. 6: gives a representation of the trellis of a code of rate 2/4 punctured for providing a rate 7/8.

FIG. 6 shows the trellis of the systematic convolutional code 2/4 described above. It gives all the possible transitions of the coder from state $\sigma(k)$ to state $\sigma(k+1)$. It is analyzed in the following manner.

Based on state $\sigma(k)=[a_0(k-1),a_0(k-2),a_1(k-1),a_1(k-2)]=$ [0000], the coder may go over to the 4 states [0000] [1000] [0010] [1010] for which the transitions generate valid couples (U1,U2) respectively, expressed in decimal notation [00] [12] [32] [20]. The assembly of the trellis is analyzed in like manner.

Figure 8:
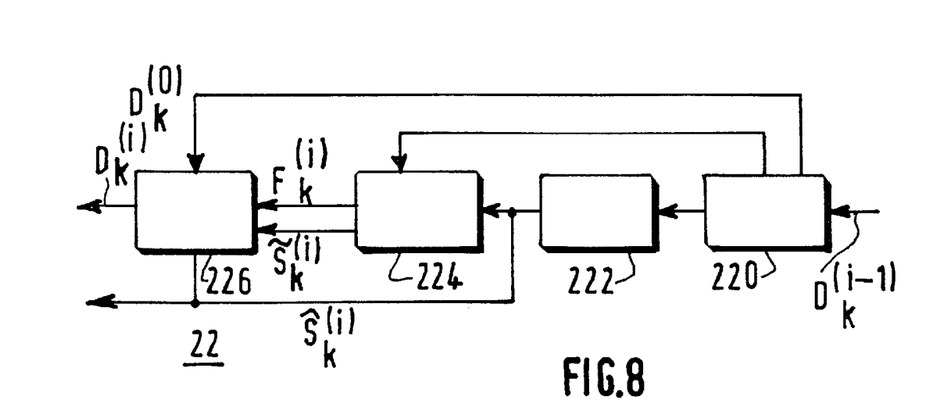
FIG. 8: shows a general circuit diagram of a decoder according to the invention.

FIG. 8 shows the general diagram of a stage of double-decision Viterbi decoder 22 according to the invention. The decoder comprises:

a sub-set 220 for computing metrics, an actual Viterbi decoder 222 which produces hard decisions, a sub-set 224 for computing the reliability of the decisions, a sub-set 226 for computing soft decisions.

The decoding of the punctured systematic convolutional codes consist of applying a soft-decision decoding algorithm. For simplicity of the exposition one takes, for example, the punctured systematic convolutional code of rate 7/8. According to the example, particularly described for the row of index 1 of Table I, a range of the product code is formed by the following symbols which have been transmitted at the transmitter end (for simplifying the writing, the line index, here i=1, is omitted in the following):

7N information symbols:
$$S=S_1, \ldots, S_{7N}$$

N code redundancy symbols
$$R=R_1, \ldots, R_N$$

2 trellis closing symbols:
$$TR=TR_1, TR_2$$

Because of imperfections of the transmission channel, the received symbols $D^{(0)}=(D_1^{(0)}, \ldots, D^{8N+2(0)})$ will present differences relative to the transmitted symbols.

At the receiver end, complex symbols are received which correspond to the 16-QAM symbols transmitted after passing through the channel. Each complex symbol is considered the sequence of 2 real symbols. Then these real symbols are stored in the memory 20 (FIG. 1) in accordance with a matrix which has the same structure as the matrix defined at the transmitter end. The real received symbols are arranged in the matrix by maintaining the same order as that used at the transmitter end. The decoding process is iterative, that is to say, that the rows of the matrix are decoded first and then the columns. The number of rows or columns to be decoded for each iteration is equal to 7N in the case of Table I (case without redundancy coding) or to 8N+2 in the case where the redundancy is coded. (Table III)

First consider the iterative decoding at the $i^{th}$ iteration for a row of the matrix, that is to say, a block of real symbols:

$D^{(i-1)}=(D_1^{(i-1)}, \ldots, D_{8N+2}^{(i)})$. The decoding produces the block: $D^{(i)}=(D_1^{(i)}, \ldots, D_{8N+2}^{(i)})$ of 8N+2 real symbols (soft output) which will be applied to the next iteration and the optimum decision $\hat{S}^{(i)}=(\hat{S}_1^{(i)}, \ldots, D_{8N+2}^{(i)})$. It is supposed that the 7N symbols $D_1^{(i-1)}, \ldots, D_{7N}^{(i-1)}$ correspond to the information symbols and the N symbols $D_{7N+1}^{(i-1)}, \ldots, D_{8N}^{(i-1)}$ correspond to the redundancy symbols of the 7/8 code and the two symbols $D_{8N+1}^{(i-1)}, D_{8N+2}^{(i-1)}$ are the trellis closing symbols. The symbols are processed in the following order:

$D_1^{(i-1)}, \ldots D_7^{(i-1)}, D_{7N+1}^{i-1}$;

$D_8^{(i-1)}, \ldots D_{14}^{(i-1)}, D_{7N+2}^{i-1}$;

$D_{7N-6}^{(i-1)}, \ldots D_{7N}^{(i-1)}, D_{8N}^{i-1}$;

$D_{8N+1}^{(i-1)}, D_{8N+2}^{(i-1)}$

The decoding takes place in six steps. The following description indicates the manner of deriving $D^{(i)}$ from $D^{(i-1)}$.

In the course of the first step, the sub-set 220 for computing metrics (FIG. 8) carries out for each symbol $D_k^{(i-1)}$ a computation of the metric MET(U) for each symbol U of the 4-AM modulation, so that:

$\text{MET}(D_k^{(i-1)}, U) = |D_k^{(i-1)} - U|^2$ for k=1, ... 8N+2.

In this manner, the metrics which are applied to the Viterbi decoder are:

a) for the transitions of the trellis where a puncturing has been applied (redundancy puncturing), that is, the symbols $D_1^{(i-1)}, \ldots, D_6^{(i-1)}$ $D_8^{i-1}, \ldots, D_{13}^{(i-1)}$

...

$D_{7l+1}^{(i-1)}, \ldots, D_{7l+6}^{(i-1)}$

...

$D_{7N-6}^{(i-1)}, \ldots, D_{7N-1}^{(i-1)}$ $D_{8N+1}^{(i-1)}, D_{8N+2}^{(i-1)}$ For each symbol, the 4 metrics of the branches of the trellis are produced during the transitions 1, 2 ... 6, 8 ... 14, 7l+1 ... 7l+6, ... 7N-6, ... 7N-1, 8N+1, 8N+2.

b) for the transitions of the trellis where there is no puncturing (all the 7 transitions), that is, the pairs of the following symbols $D_7^{(i-1)}, D_{7N+1}^{(i-1)}$ $D_{14}^{i-1}, D_{7N+2}^{(i-1)}$

...

$D_{7l+7}^{(i-1)}, D_{7N+l+1}^{(i-1)}$

...

$D_{7N}^{(i-1)}, D_{8N}^{(i-1)}$.

For each pair of symbols, the 16 metrics $\text{MET}(D_{7l+7}^{(i-1)}, D_{7N+l+1}^{(i-1)}, (U,V))$ $=\text{MET}(D_{7l+7}^{(i-1)}, U) + \text{MET}(D_{7N+l+1}^{(i-1)}, V)$ are applied to the Viterbi decoder, while U and V are the 2 4-AM symbols.

These metrics are the metrics of the trellis branches during the transitions numbered 7, 14, ... 7l, ... 7N.

During the second step, the sub-set 222 realizes a conventional Viterbi decoding of the received symbol sequences. The optimum decoded (hard-decision) sequence is obtained of the row:

$\hat{S}^{(i)} = \hat{S}_1^{(i)}, \ldots \hat{S}_{7N}^{(i)}, \ldots \hat{S}_{8N+2}^{(i)}$ The sequence of the states corresponding to the decoded states is: $\hat{\sigma}^{(i)} = \hat{\sigma}_0^{(i)}, \ldots \hat{\sigma}_{7N+2}^{(i)}$ which corresponds to 7N+2 transitions or branches, with $\hat{\sigma}_0^{(i)} = \hat{\sigma}_{7N+2}^{(i)} = 0$, with zero initial and zero final state. The vector of the state $M_j^{(i)}(\sigma)$ metric is stored for each state $\sigma=0, \ldots 15$ and for each instant j=1, ... N+2. Finally, the surviving routes are stored in a Table. All these results produced by the Viterbi decoder are used for computing the reliability.

In the course of the third step, the reliability of each symbol $\hat{S}_k^{(i)}$ of the sequence is computed in the sub-set 224 where k=1, ... 8N+2. The reliability characterizes the quality of the decoded symbols (probability of exactness). This reliability may be written as $F^{(i)} = F_1^{(i)}, \ldots F_{8N+2}^{(i)}$ The reliability of a symbol of the order k is written as:

$$F_k^{(i)} = \log\left[\frac{\left(\sum_{C(\hat{S}^{(i)})} \text{Prob}(D^{(i-1)} \mid C)\right)}{\text{Prob}(D^{(i-1)} \mid \hat{S}^{(i)})}\right]$$

where $C(\hat{S}_k^{(i)})$ is the set of codewords. The reliability $F_k^{(i)}$ may be written as:

$$F_k^{(i)} = \log\left[\sum_{C(\hat{S}_k^{(i)})} \exp\frac{d^2(D^{(i-1)}, \hat{S}^{(i)}) - d^2(D^{(i-1)}, C)}{N_0}\right].$$

By taking the main term of the sum, there may be written:
$F_k^{(i)} \cong \min_{C(\hat{S}_k^{(i)})} [d^2 C, D^{(i-1)} - d^2(\hat{S}^{(i)}, D^{(i-1)})]$.

This minimum merely corresponds to the error path which produces a decoded 4-AM symbol which lies adjacent the symbol $\hat{S}_k^{(i)}$.

Figure 9:
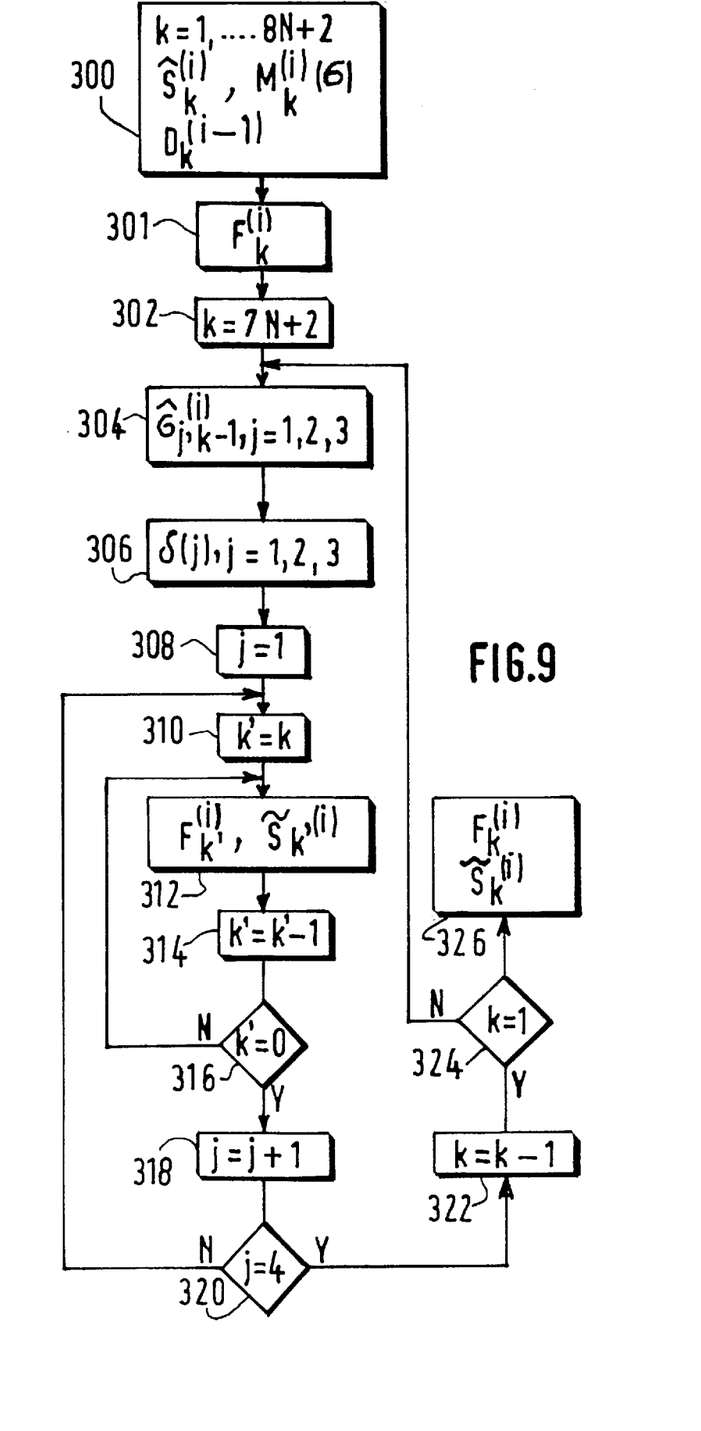
FIG. 9: shows a flow chart of the various decoding steps.

The computation of the reliability is carried out according to the following algorithm (FIG. 9). The Viterbi-decoded sequence $\hat{S}_k^{(i)}$ corresponds to a path in the trellis of length 7N+2. The algorithm for computing the reliability $F_k^{(i)}$ of the decision $\hat{S}_k^{(i)}$ for K=1, ... 8N+2 is the following:

One starts from the values of $\hat{S}_k^{(i)}, M_k^{(i)}(\sigma), D_k^{i-1}$. $F^{(i)} = (F_k^{(i)}, k=1, \ldots 8N+2)$ is initialized at infinity. In practice, a sufficiently high value is allocated to $F_k^{(i)}$, k=1, ... 8N+2.

for k=7N+2, ... 2 (step 302), where k corresponds to an instant (transition index), the following operations are carried out:

a) based on the state of the coder after the $k^{th}$ transition and the decoded path $\hat{\sigma}_k^{(i)}$, find the state $\hat{\sigma}_{k-1}^{(i)}$ after the $(k-1)^{th}$ transition of the decoded path and the 3 other precursing states of $\hat{\sigma}_k^{(i)}$, that is to say, $\sigma_{j,k-1}^{(i)}$, j=1,2,3 (step 304). For this purpose, the values of $\hat{\sigma}_k^{(i)}$ for k varying from 1 to 8N+2 are produced by the Viterbi decoder, whereas $\sigma_{j,k-1}^{(i)}$ may be stored in a memory.

Based on the state metrics $\sigma_{1,k-1}^{(i)}, \sigma_{2,k-1}^{(i)}, \sigma_{3,k-1}^{(i)}$ and $\hat{\sigma}_k^{(i)}$, computed and stored in the Viterbi decoder for k=1, ... 7N+2 and which are denoted as:

$M_{k-1}^{(i)}(\sigma_{1,k-1}^{(i)})$ $M_{k-1}^{(i)}(\sigma_{2,k-1}^{(i)})$ $M_{k-1}^{(i)}(\sigma_{3,k-1}^{(i)})$ $M_{k-1}^{(i)}(\hat{\sigma}_k^{(i)})$.

the 3 cumulated metrics of the state $\hat{\sigma}_k^{(i)}$ are computed for the 3 paths coming from the 3 states $\sigma_{j,k-1}^{(i)}$, j=1,2,3. These three cumulated metrics are: $\delta(j)=M_{k-1}^{(i)}(\sigma_{1,k-1}^{(i)})+(I_{j,k}^{(i)}-D_k^{(i-1)})^2$ if the transition from the instant k−1 to the instant k corresponds to a puncturing (k multiple of 7) and $\delta(j)=M_{k-1}^{(i)}(\sigma_{1,k-1}^{(i)})+(I_{j,k}^{(i)}-D_k^{(i-1)})^2+D_{l_k}^{(i-1)}-R_{j,l_k}^{(i)})^2$ if there is no puncturing for the transition from the instant k−1 to the instant k (step 306).

In these equations, the symbols $D_k^{(i-1)}, D_{l_k}^{(i-1)}$ are the symbols received before the $i^{th}$ iteration which corresponds to the information symbols and the redundancy symbols respectively, of the transition from the instant (k−1) to the instant k and the symbols $I_{j,k}^{(i)}, R_{j,l_k}^{(i)}$ are the 4-AM information symbols U1 and the redundancy symbols U2 respectively, allocated to the transition from the state $\sigma_{j,k-1}^{(i)}$ to the state $\hat{\sigma}_k^{(i)}$ (see FIG. 6). The information symbols $I_{j,k}^{(i)}$ and redundancy symbols $R_{j,l_k}^{(i)}$ allocated to the transition from the state $\sigma_{j,k-1}^{(i)}$ to the state $\hat{\sigma}_k^{(i)}$ are stored in a memory during the Viterbi decoding. The index $l_k$ is computed only when there is no puncturing (k multiple of 7):

$l_k = 7N + K/7.$ c)—compute the difference between the optimum metric and each of the cumulated metrics:

$\Delta(j)=\delta(j)-M_k^{(i)}(\hat{\sigma}_k^{(i)})$, j=1,2,3 where $M_k^{(i)}(\hat{\sigma}_k^{(i)})$ is the optimum metric of the state $\hat{\sigma}_k^{(i)}$.

Subsequently, the 3 precursing survivors of the state $\hat{\sigma}_k^{(i)}$ are examined. The survivor is increased from the order j of $\hat{\sigma}_k^{(i)}$ to $\sigma_{j,k-1}^{(i)}$. Thereafter, each survivor of the $j^{th}$ order of the state $\sigma_{j,k-1}^{(i)}$ is examined up to the initial state $\sigma=0$, which consists of making the index of the transition vary from k to 1.

To reduce the complexity, one may examine the 3 survivors of the state $\sigma_{j,k-1}^{(i)}$ up to the state of the survivor at the instant k-L instead of the instant 1, thus a fixed number of transitions. For L=10, the degradation of performance is negligible.

The 4-AM symbol(s) allocated to the $k'^{th}$ transition of the survivor of the $j^{th}$ order is compared to the decoded symbol (s) $\hat{S}_{k'}^{(i)}$ et $\hat{S}_{7N+k'/7}^{(i)}$ for k' varying from k to 1 or from k to (k-L) in the second case. If they are adjacent, (situated at a distance of 2) min($\Delta(j), F_{k'}^{(i)}$) is computed and this minimum is allocated to $F_{k'}^{(i)}$:

either $F_{k'}^{(i)}=\min(\Delta(j),F_{k'}^{(i)})$, if the symbol $\hat{S}_{k'}^{(i)}$ and the information symbol allocated to the $k'^{th}$ transition of the survivor j are adjacent (step 312). The same is done for $F_{7N+k'/7}^{(i)}$ for k' which is a multiple of 7 (no puncturing), or $F_{7N+k'/7}^{(i)}=\min(\Delta(j),F_{7N+k'/7}^{(i)})$, if the symbol $\hat{S}_{7N+k'/7}^{(i)}$ is adjacent the redundancy symbol allocated to the $k'^{th}$ transition of the survivor of the $j^{th}$ order (step 312).

d) compute the table of the symbols $\tilde{S}_k^{(i)}$ which are adjacent $\hat{S}_k^{(i)}$ which corresponds to the minimum, for k varying from 1 to 8N+2, and, with each update of the reliability $F_{k'}^{(i)}$, update the symbol $\tilde{S}_{k'}^{(i)}$ by replacing it by the 4-AM information symbol relating to the transition of the $k'^{th}$ order of the survivor j. The same goes for the symbol $\tilde{S}_{7N+k'/7}^{(i)}$ if k' is a multiple of 7. Finally, the reliabilities $F_k^{(i)}$ are obtained of the decoded symbol $\hat{S}_k^{(i)}$ as well as the corresponding adjacent symbol $\tilde{S}k^{(i)}$ for k=1, . . . 8N+2 (step 326).

During the fourth step, the reliability is subsequently normalized for permitting of computing the soft decision $\tilde{D}_k^{(i)}$.

Three methods can be used for computing the normalized reliability $F_k^{norm(i)}$. One may compute:
either $F_k^{norm(i)}=F_k^{(i)}/\bar{F}$ or $F_k^{norm(i)}=F_k^{(i)}+(1-\bar{F})$ or $F_k^{norm(i)}=(F_k^{(i)}/\beta_1)+\beta_2$ where $\bar{F}$ is equal to the average of $F_k^{(i)}$ computed of the whole matrix of the reliabilities, and $\beta_1$ and $\beta_2$ are constants verifying $\bar{F}=\beta_1(1-\beta_2)$.

In the course of the fifth step, non-weighted soft decisions are computed (sub-set 226). The soft decision $\tilde{D}_k^{(i)}$ is computed based on the optimum decision $\hat{S}_k^{(i)}$ produced by the Viterbi decoder, on its normalized reliability $F_k^{norm(i)}$ and on the sequence of 4-AM symbols $\tilde{S}_k^{(i)}$ produced in the respective steps 4 and 3. The 4-AM symbol is a symbol adjacent the symbol $\hat{S}_k^{(i)}$, that is to say that $|\tilde{S}_k^{(i)}-\hat{S}_k^{(i)}|=2$ and which corresponds to the 4-AM symbol that is most likely after the symbol $\hat{S}_k^{(i)}$. The symbol $\tilde{D}_k^{(i)}$ is given by:

$\tilde{D}_k^{(i)}=1/2(\hat{S}_k^{(i)}+\tilde{S}_k^{(i)})+sgn(\hat{S}_k^{(i)}-\tilde{S}_k^{(i)})F_k^{norm(i)}$ where the function sgn is defined by:

$$\text{sgn}(x) = \begin{pmatrix} 1 \text{ si } x > 0 \\ 0 \text{ si } x = 0 \\ -1 \text{ si } x < 0 \end{pmatrix}.$$

Thus, the symbol $\tilde{D}_k^{(i)}$ corresponds to a symbol situated at the distance $F_k^{norm(i)}$ of the decision threshold between $\hat{S}_k^{(i)}$ and $\tilde{S}_k^{(i)}$. As $E(F_k^{norm(i)})=1$, the symbols $\tilde{D}_k^{(i)}$ will be centered around 4-AM symbols.

To improve the performance during the sixth step, $\tilde{D}_k^{(i)}$ is weighted with the symbols received by the channel $D_k^{(0)}$ which are k stored in the memory 20 for computing $D_k^{(i)}$:

$D_k^{(i)}=\alpha_i \tilde{D}_k^{(i)}+(1-\alpha_i)D_k^{(0)}$ where $\alpha_i$ is a weight factor. For example: $\alpha_1=0.6$; $\alpha_2=0.9$; $\alpha_i=1$ for i higher than 2. The object is to reduce the error propagation effect during the first iterations. The steps 5 and 6 are carried out together in the sub-set 226.

We claim:

1. A method of providing error protection for transmitted input data in a digital transmission system, said method comprising a coding phase in which the input data is encoded and a decoding phase in which transmitted encoded data is iteratively decoded; the coding phase including a first coding step combined with a second coding step, the first coding step comprising a systematic convolutional encoding of the input data in accordance with a trellis code, the second coding step comprising allocation of the trellis encoded data to a set of digitally modulated symbols; characterized in that:

the trellis code has a coding rate of M/2M, where M is an integer greater than 1, and is subjected to puncturing to obtain a higher code rate;

the first coding step further comprises forming the trellis encoded data into a matrix having row and column components, using the row and column components of said matrix to generate a product code in blocks, and providing trellis closure by additional of redundant data;

the allocation performed in the second coding step combines the product code with a set of $2^{2M}$-state quadrature amplitude modulation values; and the iterative decoding in the decoding phase is performed by block decoding.

2. A method as claimed in claim 1, wherein the systematic convolutional encoding of the input data encodes two input bits into four output bits by linear combination.

3. A digital transmission system which provides error protection for transmitted input data, comprising coding means for encoding input data and decoding means for iteratively decoding transmitted encoded data; the coding means having a first sub-set combined with a second sub-set, the first sub-set being adapted to provide systematic convolutional encoding of the input data in accordance with a trellis code, the second sub-set being adapted to provide allocation of the trellis encoded data to a set of digitally modulated symbols; characterized in that:

the trellis code has a coding rate of M/2M, where M is an integer greater than 1;

the first sub-set is further adapted to
subject the symbols of the trellis encoded data to puncturing to obtain a higher coding rate; and
form the punctured trellis encoded data into a matrix having row and column components, the row and column components of said matrix being used to generate a product code in data blocks, trellis closure being provided by addition of redundant data;

the second sub-set is adapted to provide said allocation by combining the product code with a set of $2^{2M}$-state quadrature amplitude modulation values; and the decoding means is adapted to iteratively decode the transmitted encoded data by block decoding.

4. A digital transmission system as claimed in claim 3, wherein the first sub-set of said coding means comprises a state machine which defines successive coding states during trellis encoding of the input data and provides redundancy symbols for trellis closure.

5. A digital transmission system as claimed in claim 4, wherein encoding of the input data by the first sub-set encodes every two input bits into four output bits by adding two redundancy bits, the first sub-set comprises two shift cell stages, and the output bits are derived by linearly combining data from the shift cell stages.

6. A digital transmission system as claimed in claim 3, wherein the encoding of the input data by the first sub-set encodes every two input bits into four output bits by adding two redundancy bits, the first sub-set comprises two shift cell stages, and the output bits are derived by linearly combining data from the shift cell stages.

* * * * *